United States Patent
Cousy

[11] Patent Number: 5,982,051
[45] Date of Patent: Nov. 9, 1999

[54] ELECTRONIC TWO-WAY SWITCHING CIRCUIT

[75] Inventor: Jean-Pierre Cousy, Verneuil sur Vienne, France

[73] Assignees: Legrand; Legrand SNC, both of Limoges, France

[21] Appl. No.: 09/138,569

[22] Filed: Aug. 24, 1998

[30] Foreign Application Priority Data

Aug. 22, 1997 [FR] France .................................. 97 10575

[51] Int. Cl.$^6$ .................................................. H01H 47/00
[52] U.S. Cl. ........................................ 307/115; 307/141.8
[58] Field of Search ........................... 307/113–115, 132, 307/139, 140, 141.8; 200/518

[56] References Cited

U.S. PATENT DOCUMENTS

| | | | |
|---|---|---|---|
| 529,532 | 11/1894 | Scribner | 307/114 |
| 1,170,924 | 2/1916 | Matson | 307/114 |
| 2,098,631 | 5/1937 | Parissi | 307/114 |
| 2,201,898 | 10/1940 | Holiday | 307/114 |
| 3,119,046 | 1/1964 | Usher | 307/114 |
| 3,809,965 | 5/1974 | Groth et al. . | |
| 3,872,319 | 3/1975 | Platzer | 307/114 |
| 4,090,107 | 5/1978 | Seib | 315/156 |
| 4,117,294 | 9/1978 | Appelquist et al. | 219/10.55 |
| 4,459,531 | 7/1984 | Dumont et al. . | |
| 4,755,691 | 7/1988 | Bethea | 307/114 |
| 4,855,612 | 8/1989 | Koga et al. | 307/140 |
| 5,170,068 | 12/1992 | Kwiatkowski | 307/31 |
| 5,519,256 | 5/1996 | Goodbridge | 307/10.8 |

FOREIGN PATENT DOCUMENTS 2 579 008  9/1986  France .
1 762 738  2/1981  Germany .

OTHER PUBLICATIONS

"An SPDT Triac Switch for AC Loads", p. 43, Devices and Systems at Work, vol. 18, No. 2, Feb. 1971.
G. Hall, "Triacs can misfire with the wrong triggering", pp. 65–68, Electronic Engineering, vol. 45, No. 544, Jun. 1973.
G.A. Stevens, "A.c. full–wave static switch", pp. 40 and 43, vol. 10, No. 1, Jan. 1977.
H. Christ, "Leistungssteuerung und–regelung mit Triacs", pp. 37–40, Elektronik, vol. 26, No. 12, Dec. 1977.
T.C. McNulty, "Power Switching Using solid–State Relay", pp., pp. 1–5, RCA Solid State Division, Mar., 1973.

Primary Examiner—Fritz Fleming
Assistant Examiner—Ed Garlerp
Attorney, Agent, or Firm—Young & Thompson

[57] ABSTRACT

A two-way switching circuit for connecting a supply power to a load comprises two electronic switches connected to each other. Each of the two electronic switches includes two electronic switch units connected to each other. Each of the two electronic switches has a control circuit including a common actuator selectively connected to both of the electronic switch units thereof for alternately turning on the respective electronic switch units. A first of the electronic switch unit of each of the two electronic switches is connected to each other and a second of the electronic switch units of each of the electronic switches is connected to each other, whereby switching circuit is thus adapted to connect a power supply to a load when both of the first electronic switch units or both of the second electronic switches are on.

12 Claims, 1 Drawing Sheet

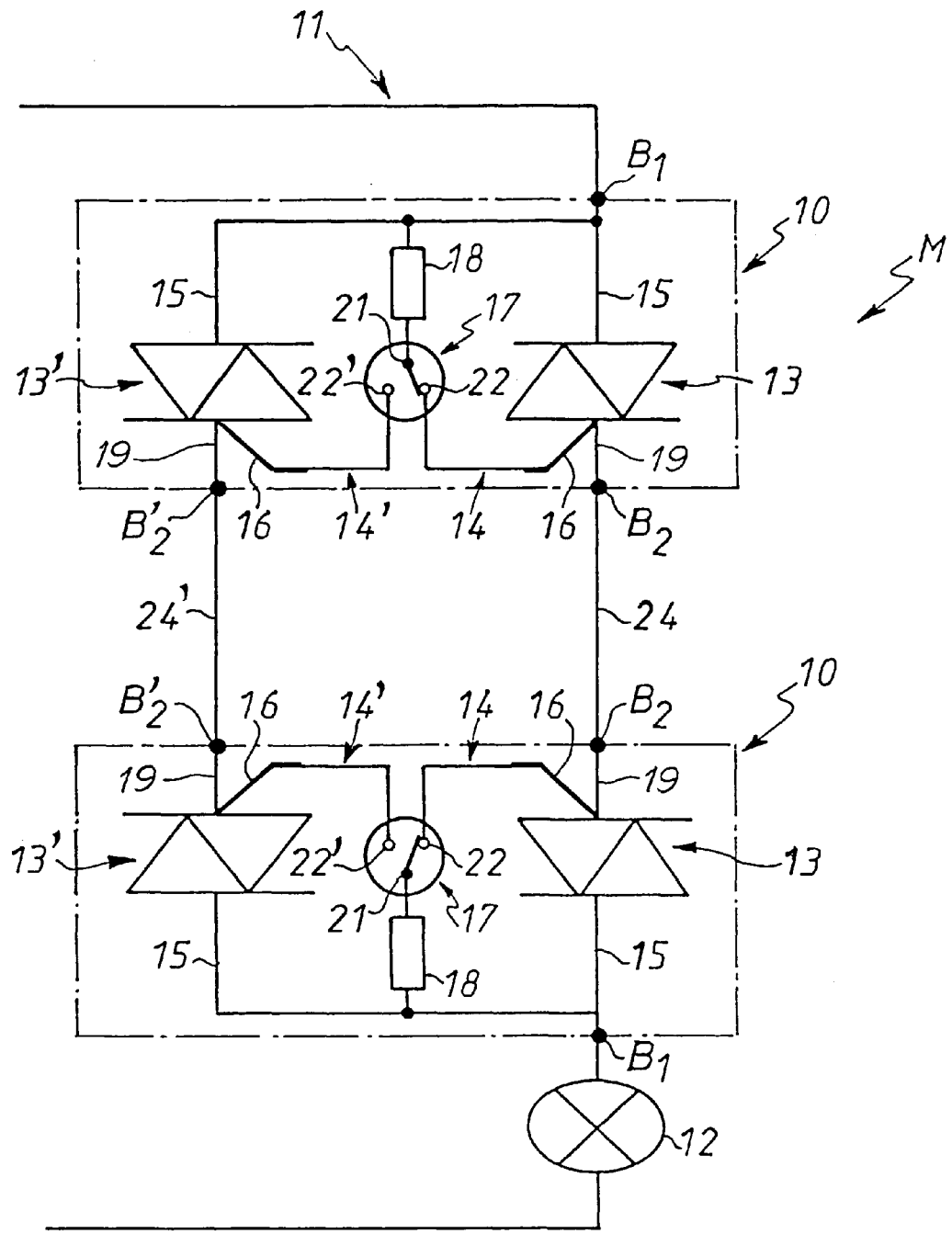

ELECTRONIC TWO-WAY SWITCHING CIRCUIT

BACKGROUND OF THE INVENTION

1. Field of the Invention

The present invention concerns two-way switching circuits of the kind used to control a load alternately from one of two separate control location which may be far apart.

2. Description of the Prior Art

At present such two-way switching circuits use exclusively mechanical switches, with their inherent disadvantages, in particular arcing which is liable to lead to serious deterioration of the electrical contacts and generate noise.

The present invention is based on an observation that it is possible to construct such two-way switching circuits using electronic switches.

SUMMARY OF THE INVENTION

According to the present invention a two-way switching circuit comprising two electronic switches each including two electronic switch units, the control circuits of the electronic switch having a common actuator adapted to turn them on alternately.

Inherently operating in a way that does not cause arcing and is silent, this two-way switching circuit is advantageously suitable for control by touch-sensitive switches, with the advantages of limited travel and low noise levels.

The present switching circuit can advantageously be installed in place of an existing mechanical switch, without using the neutral.

Features and advantages of the invention will emerge from the following description given by way of example with reference to the accompanying drawing.

BRIEF DESCRIPTION OF THE DRAWING

The single FIGURE is a block schematic of a two-way switching circuit in accordance with the invention.

DETAILED DESCRIPTION OF THE PREFERRED EMBODIMENTS

As shown in the FIGURE, the two-way switching circuit M of the invention has two electronic switches 10 connected between two input terminals B1 in a power circuit 11 for supplying a load 12 to be controlled.

As in the embodiment shown, the electronic switches 10 are preferably identical.

Each has between the corresponding input terminal B1 and two output terminals B2, B'2, two electronic switch units 13, 13' the control circuits 14, 14' of which have a common actuator 17 adapted to turn them on alternately.

In the embodiment shown the electronic switch units 13, 13' for each of the electronic switches 10 are triacs and their control circuits 14, 14' are between their anode 15 and their trigger 16.

Anode 15 is connected to the input terminal B1 and anode 19 is connected to the corresponding output terminal B2, B'2. The trigger 16 is at the same end as the corresponding terminal B2, B'2.

As in the embodiment shown, the control circuits 14, 14' of the two electronic switch units 13, 13' of each electronic switch 10 have a common current limiter resistor 18 between the actuator 17 and the input terminal B1.

In the embodiment shown the actuator 17 for each of the electronic switches 10 is a sealed switch.

The center terminal 21 of the actuator 17 is connected via the current limiter resistor 18 to the anode 15 of each of the two electronic switch units 13, 13' and its lateral terminals 22, 22' are connected to their trigger 16.

Finally, the electronic switches 10 are connected to each other by the anodes 19 of their electronic switch units 13, 13'.

The anode 19 of each of the two electronic switch units 13, 13' of one of the electronic switches 10, and therefore the corresponding output terminal B2, B'2, is connected to the anode 19 of the corresponding electronic switch unit 13, 13' of the other electronic switch 10 and therefore to the corresponding output terminal B2, B'2.

As shown here, the corresponding connections are effected by means of single wires 24, 24', for example, which in practice are part of the electrical supply circuitry.

For each of the electronic switches 10 the electronic switch units 13, 13' are alternately on and off.

The system is on when the same electronic switch unit 13 or 13' is on in both electronic switches 10 and off otherwise.

In either case, the state of the system can be changed and the load 12 can therefore be supplied with power or not by operating one of the actuators 17.

Alternatively some other control means may be available to the user.

Be this as it may, each time the actuator 17 is operated, the electronic switch units 13, 13' of the corresponding electronic switch 10 both change state.

In the configuration shown in the FIGURE, for example, for each electronic switch 10 the electronic switch unit 13 is on when the electronic switch unit 13' is off and the load 12 is supplied with power.

If, as shown in the drawing, the actuator 17 of one of the electronic switches 10 is operated, the electronic switch unit 13 of that electronic switch 10 is turned off which cuts off the supply of power to the load 12.

Thus if the actuator 17 of the other electronic switch 10 is then operated, the electronic switch units 13' of each of the two electronic switches 10 turn on simultaneously, which again supplies power to the load 12, even though the electronic switch unit 13 of the other electronic switch 10 is turned off.

In this configuration of the system, which is the opposite of the configuration illustrated, if the actuator 17 of one of the electronic switches 10 is operated.

The electronic switch units 13, 13' of each of the electronic switches 10 are preferably identical. The procedure is as already described.

For each of the electronic switches 10 the value of the current limiter resister 18 is preferably less than the voltage on triggering the electronic switch units 13, 13' divided by the value of the minimal trigger current needed by an electronic switch unit 13, 13' for triggering.

Accordingly, the spurious harmonics generated at trigger are tolerable.

The present invention is naturally not limited to the embodiment described and shown, but encompasses any variant execution thereof.

There is claimed:

1. A two-way switching circuit for connecting a supply power to a load comprising two electronic switches connected to each other, each of the two electronic switches including two electronic switch units connected to each other, each of said two electronic switches having a control circuit including a common actuator selectively connected to both of said electronic switch units thereof for alternately turning on the respective electronic switch units, a first of said electronic switch units of each of said two electronic switches being connected to each other and a second of said electronic switch units of each of said electronic switches being connected to each other, whereby said switching circuit is adapted to connect a power supply to a load when both of said first electronic switch units or both of said second electronic switches are on.

2. The two-way switching circuit claimed in claim 1, wherein each of said electronic switch units has at least an anode and a trigger, each of said control circuits being connected between the anode and the trigger of said electronic switch units of the respective electronic switches.

3. The two-way switching circuit claimed in claim 1, wherein each of said electronic switch units comprises a triac.

4. The two-way switching circuit claimed in claim 3, wherein each said triac has two anodes and a trigger, said control circuits being connected between one of the anodes and the trigger of each of the electronic switch units of the respective electronic switches.

5. The two-way switching circuit claimed in claim 1, wherein each of said control circuits also comprises a common current limiting resistor.

6. The two-way switching circuit claimed in claim 1, wherein each of said common actuators comprises a two-pole single throw switch.

7. The two-way switching circuit claimed in claim 6, wherein each of said electronic switch units comprises an anode and a trigger, and each of said actuators has a common terminal connected to the anodes of both of said electronic switch units thereof and two lateral terminals, each of said lateral terminals being connected to said trigger of one of said electronic switch units of the respective electronic switch.

8. The two-way switching circuit claimed in claim 1, wherein said two electronic switches are identical.

9. The two-way switching circuit claimed in claim 1, wherein each of said electronic switch units has two anodes and a trigger, said electronic switches being connected together through respective anodes of their electronic switch units.

10. A two-way switching circuit for connecting a supply power to a load comprising two electronic switches connected to each other, each of the two electronic switches including two electronic switch units connected to each other, each of said two electronic switch units having first, second and third terminals, each of said two electronic switches having a control circuit including a common actuator selectively connected to each of said electronic switch units thereof for alternately turning on the electronic switch units, said first terminal of each of said electronic switch units of each said electronic switch being connected together, said second terminals of each of said electronic switch units of one of said electronic switch being connected to respective second terminals of said electronic switch units of the other of said electronic switches, and said third terminals of electronic switch units of each said electronic switch being connected to the respective common actuator.

11. The two-way switching circuit according to claim 10, wherein said first terminals are input terminals, said second terminals are output terminals and the third terminals are triggers.

12. The two-way switching circuit according to claim 11, wherein said electronic switch units are all triacs, the first terminals being located at a first anode, the second terminals are located at second anodes and the third terminals are located at triggers.

* * * * *